United States Patent
Aurongzeb et al.

(10) Patent No.: US 9,860,620 B2
(45) Date of Patent: Jan. 2, 2018

(54) METHOD FOR FORMING A LAYERED STRUCTURAL MEMBER

(71) Applicant: Dell Products L.P., Round Rock, TX (US)

(72) Inventors: Deeder M. Aurongzeb, Round Rock, TX (US); Mitchell Anthony Markow, Hutto, TX (US); Andrew Thomas Sultenfuss, Leander, TX (US); Chuan Beng Sim, Shanghai (CN); Douglas Jarrett Peeler, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 14/306,532

(22) Filed: Jun. 17, 2014

(65) Prior Publication Data

US 2015/0365747 A1 Dec. 17, 2015

(51) Int. Cl.
*H04R 31/00* (2006.01)
*H03H 3/02* (2006.01)
(Continued)

(52) U.S. Cl.
CPC ............. *H04R 1/028* (2013.01); *H03H 3/02* (2013.01); *H03H 3/04* (2013.01); *H03H 9/1092* (2013.01); *H04R 1/025* (2013.01); *H04R 17/00* (2013.01); *H04R 17/005* (2013.01); *H04R 17/10* (2013.01); *H04R 31/00* (2013.01); *H04R 31/006* (2013.01); *H05K 3/0041* (2013.01); *B09B 3/00* (2013.01); *G06F 1/1613* (2013.01); *G06F 1/1616* (2013.01); *G06F 1/1688* (2013.01); *H04R 2499/11* (2013.01); *H04R 2499/15* (2013.01);
(Continued)

(58) Field of Classification Search
CPC ...... H04R 31/00; H04R 31/006; H04R 1/025; H04R 17/00; H04R 17/10; H04R 17/005; H04R 2499/11; H04R 2499/15; H04R 1/028; H05K 3/0041; Y10T 29/42; Y10T 29/49005; Y10T 29/4913; Y10T 29/43; H03H 3/02; H03H 3/04; H03H 9/1092; G06F 1/1613; G06F 1/1616; G06F 1/1688; B09B 3/00
See application file for complete search history.

(56) References Cited

U.S. PATENT DOCUMENTS 5,382,315 A * 1/1995 Kumar ................ H05K 3/0041
216/39
5,706,564 A * 1/1998 Rhyne ..................... Y10T 29/42
29/25.35
(Continued)

FOREIGN PATENT DOCUMENTS

JP 2004-312581 * 11/2004

*Primary Examiner* — A. Dexter Tugbang
(74) *Attorney, Agent, or Firm* — Jackson Walker L.L.P.

(57) ABSTRACT

A method for forming a layered structural member may include providing a first outer layer of material and a second outer layer of material, placing between the first outer layer and the second outer layer a layer of core material, and placing between the first outer layer and the second outer layer a piezoelectric transducer, the piezoelectric transducer configured to convert an audio signal received by the piezoelectric transducer into at least one of a mechanical pressure, acceleration, strain and force causing the layered structured member to generate sound.

20 Claims, 3 Drawing Sheets

(51) Int. Cl.
*H04R 1/02* (2006.01)
*H03H 3/04* (2006.01)
*H05K 3/00* (2006.01)
*H03H 9/10* (2006.01)
*H04R 17/10* (2006.01)
*H04R 17/00* (2006.01)
*G06F 1/16* (2006.01)
*B09B 3/00* (2006.01)

(52) U.S. Cl.
CPC ............... *Y10T 29/42* (2015.01); *Y10T 29/43* (2015.01); *Y10T 29/49005* (2015.01); *Y10T 29/4913* (2015.01)

(56) References Cited

U.S. PATENT DOCUMENTS

| | | | | |
|---|---|---|---|---|
| 6,304,434 B1 * | 10/2001 | Markow | ............... | G06F 1/1616 312/223.1 |
| 6,384,697 B1 * | 5/2002 | Ruby | ............... | H03H 3/02 333/187 |
| 6,427,017 B1 * | 7/2002 | Toki | ............... | H04R 17/00 181/170 |
| 7,028,400 B1 * | 4/2006 | Hiner | ............... | H05K 3/243 29/825 |
| 2002/0136399 A1 * | 9/2002 | Windeballe | ............ | H04R 1/025 379/433.03 |
| 2004/0052387 A1 * | 3/2004 | Norris | ............... | H04R 31/006 381/190 |
| 2005/0255239 A1 * | 11/2005 | Zhu | ............... | Y10T 29/42 427/226 |
| 2007/0193414 A1 * | 8/2007 | Martin | ............... | B09B 3/00 75/751 |
| 2008/0019544 A1 * | 1/2008 | Ogura | ............... | Y10T 29/42 381/190 |
| 2008/0101625 A1 * | 5/2008 | Fazzio | ............... | H04R 31/00 381/92 |
| 2008/0266023 A1 * | 10/2008 | Tanaka | ............... | H03H 9/1092 333/133 |
| 2009/0236934 A1 * | 9/2009 | Aikawa | ............... | Y10T 29/42 310/313 B |
| 2010/0072860 A1 * | 3/2010 | Kim | ............... | H04R 31/00 310/324 |
| 2012/0234921 A1 * | 9/2012 | Tiedmann | ............ | Y10T 29/4913 235/488 |

* cited by examiner

METHOD FOR FORMING A LAYERED STRUCTURAL MEMBER

TECHNICAL FIELD

The present disclosure relates in general to information handling systems, and more particularly to incorporating audio transducers into chassis and other structural components of information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In addition to the above functions, many information handling systems include audio systems for outputting sound (e.g., speech, music, video soundtracks, etc.) to a user. Such sound systems may include audio transducers, such as loudspeakers, for generating such sounds based on audio signals communicated to such loudspeakers. As information handling systems become thinner, space within an information handling system for housing such audio transducers is becoming smaller, in turn meaning that audio transducers must be made smaller, which may lead to decreases in audio quality.

SUMMARY

In accordance with the teachings of the present disclosure, the disadvantages and problems associated with audio quality in smaller-form-factor information handling systems may be reduced or eliminated.

In accordance with embodiments of the present disclosure, a method for forming a layered structural member may include providing a first outer layer of material and a second outer layer of material, placing between the first outer layer and the second outer layer a layer of core material, and placing between the first outer layer and the second outer layer a piezoelectric transducer, the piezoelectric transducer configured to convert an audio signal received by the piezoelectric transducer into at least one of a mechanical pressure, acceleration, strain and force causing the layered structured member to generate sound.

In accordance with these and other embodiments of the present disclosure, a layered structural member may include a first outer layer of material, a second outer layer of material, a layer of core material formed between the first outer layer and the second outer layer, and a piezoelectric transducer formed between the first outer layer and the second outer layer, the piezoelectric transducer configured to convert an audio signal received by the piezoelectric transducer into at least one of a mechanical pressure, acceleration, strain and force causing the layered structured member to generate sound.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 6, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more busses operable to transmit communication between the various hardware components.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

Figure 1:
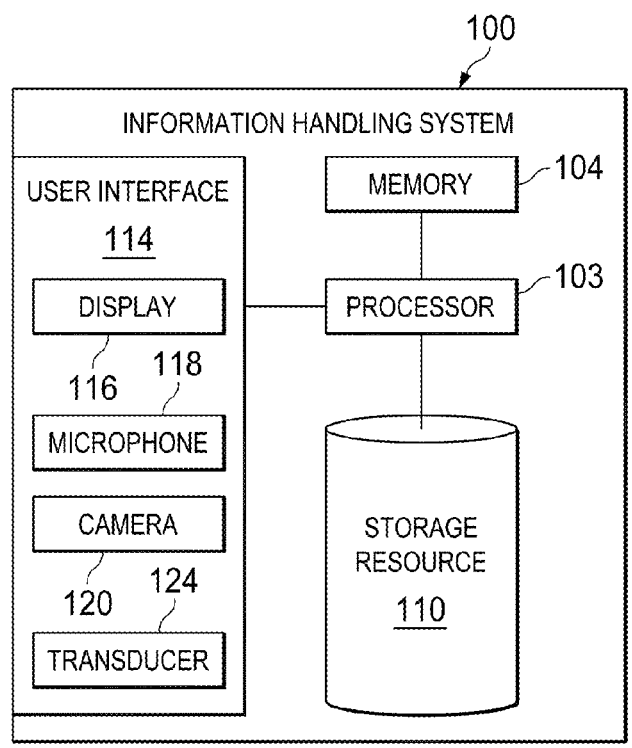
FIG. 1 illustrates a functional block diagram of selected components of an example information handling system, in accordance with embodiments of the present disclosure.

FIG. 1 illustrates a functional block diagram of selected components of an example information handling system 100, in accordance with embodiments of the present disclosure. In some embodiments, information handling system 100 may be a personal computer (e.g., a desktop computer or a portable computer). In other embodiments, information handling system 100 may comprise a mobile device (e.g., smart phone, a tablet computing device, a handheld computing device, a personal digital assistant, or any other device that may be readily transported on a person of a user of such mobile device). In yet other embodiments, information handling system 100 may comprise a Voice over Internet Protocol (VoIP) phone (e.g., a purpose-built hardware device that appears much like an ordinary landline telephone).

As depicted in FIG. 1, information handling system 100 may include a processor 103, a memory 104 communicatively coupled to processor 103, a storage resource 110 communicatively coupled to processor 103, and a user interface 114 communicatively coupled to processor 103.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104, storage resource 110, and/or another component of information handling system 100.

Memory 104 may be communicatively coupled to processor 103 and may include any system, device, or apparatus configured to retain program instructions and/or data for a period of time (e.g., computer-readable media). Memory 104 may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to its associated information handling system 100 is turned off.

Storage resource 110 may include a system, device, or apparatus configured to store data. Storage resource 110 may include one or more hard disk drives, magnetic tape libraries, optical disk drives, magneto-optical disk drives, solid state storage drives, compact disk drives, compact disk arrays, disk array controllers, and/or any other systems, apparatuses or devices configured to store data. In certain embodiments, storage resource 110 may include one or more storage enclosures configured to hold and/or power one or more of such devices. In the embodiments represented by FIG. 1, storage resource 110 may reside within information handling system 100. However, in other embodiments, storage resource 110 may reside external to information handling system 100 (e.g., may be coupled to information handling system 100 via a network).

User interface 114 may comprise any instrumentality or aggregation of instrumentalities by which user may interact with information handling system 100. For example, user interface 114 may permit a user to input data and/or instructions into information handling system 100 (e.g., via a keypad, keyboard, touch screen, microphone, camera, and/or other data input device), and/or otherwise manipulate information handling system 100 and its associated components. User interface 114 may also permit information handling system 100 to communicate data to a user (e.g., via a display device, speaker, and/or other data output device). As shown in FIG. 1, user interface 114 may include one or more of a display 116, microphone 118, camera 120, and speaker 124.

Display 116 may comprise any suitable system, device, or apparatus configured to display human-perceptible graphical data and/or alphanumeric data to a user. For example, in some embodiments, display 116 may comprise a liquid crystal display.

Microphone 118 may comprise any system, device, or apparatus configured to convert sound incident at microphone 118 to an electrical signal that may be processed by processor 103. In some embodiments, microphone 118 may include a capacitive microphone (e.g., an electrostatic microphone, a condenser microphone, an electret microphone, a microelectromechanical systems (MEMs) microphone, etc.) wherein such sound is converted to an electrical signal using a diaphragm or membrane having an electrical capacitance that varies as based on sonic vibrations received at the diaphragm or membrane.

Camera 120 may comprise any system, device, or apparatus configured to record images (moving or still) into one or more electrical signals that may be processed by processor 103.

Transducer 124 may comprise any system, device, or apparatus configured to produce sound in response to electrical audio signal input. In some embodiments, a transducer 124 may comprise a piezoelectric speaker, a device that uses the piezoelectric effect to convert an electrical current into a mechanical pressure, acceleration, strain or force which in turn generates sound. In other embodiments, transducer 124 may comprise a microelectromechanical systems (MEMs) speaker. In yet other embodiments, transducer 124 may comprise a nanotube-based micro-array capable of generating sound in response to an electrical current.

In addition to processor 103, memory 104, storage resource 110, and user interface 114, information handling system 100 may include one or more other information handling resources. Such an information handling resource may include any component system, device or apparatus of an information handling system, including without limitation, a processor, bus, memory, I/O device and/or interface, storage resource (e.g., hard disk drives), network interface, electro-mechanical device (e.g., fan), display, power supply, and/or any portion thereof. An information handling resource may comprise any suitable package or form factor, including without limitation an integrated circuit package or a printed circuit board having mounted thereon one or more integrated circuits.

Figure 2:
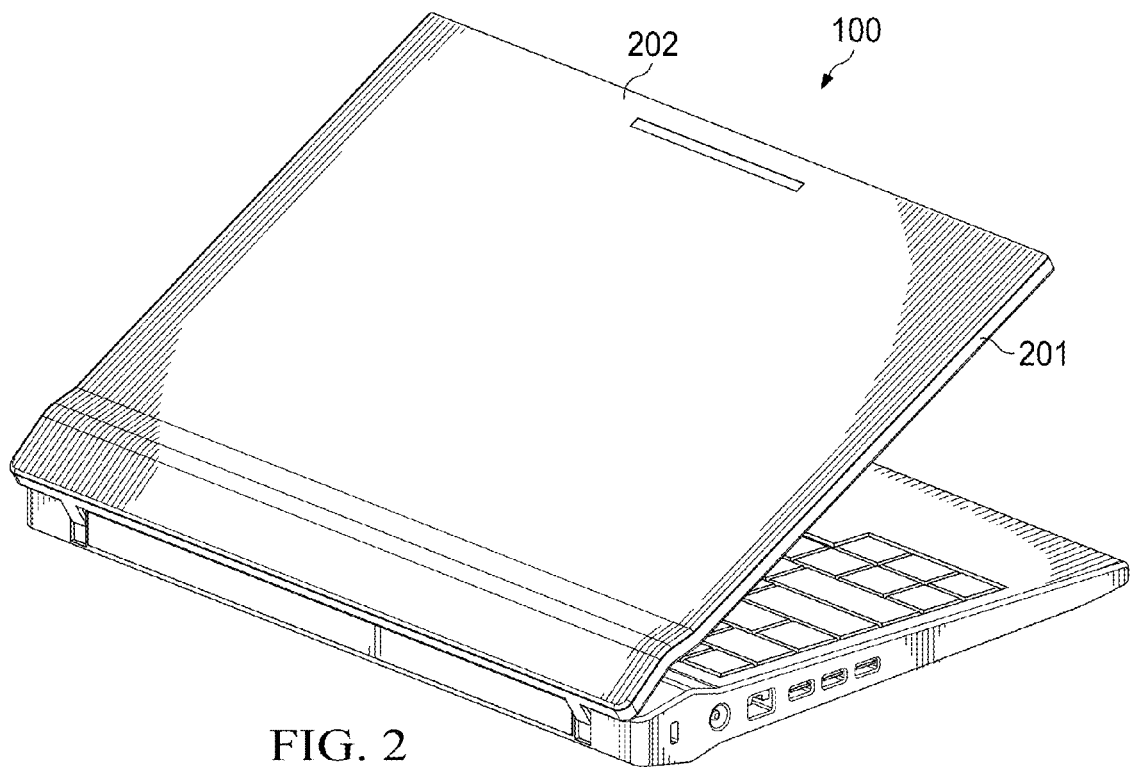
FIG. 2 illustrates an exterior view of an example information handling system, in accordance with embodiments of the present disclosure.

FIG. 2 illustrates an exterior view of example information handling system 100, in accordance with embodiments of the present disclosure. Although FIG. 2 depicts information handling system 100 as a laptop or notebook computer, information handling system 100 may comprise any type of information handling system (e.g., a mobile device sized and shaped to be readily transported and carried on a person of a user of information handling system 100, a desktop computer, a tower computer, a server, etc.).

As shown in FIG. 2, information handling system 100 may comprise a chassis 201. In general, a chassis 201 may comprise one or more structural members configured to enclose information handling resources (e.g., processors, memories, etc.) of information handling system 100 and provide structural strength in order to protect the various information handling resources of information handling system 100 from damage. As also depicted in FIG. 2, chassis 201 may comprise one or more layered structural members 202.

Figure 3:
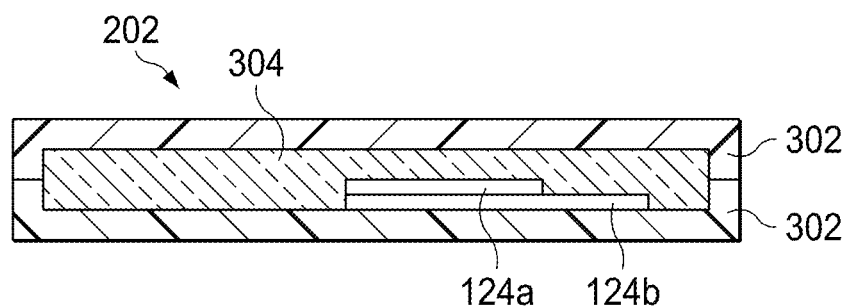
FIG. 3 illustrates a side elevation view of a layered structural member used in a structural component of the information handling system of FIG. 2, in accordance with embodiments of the present disclosure.

FIG. 3 illustrates a side elevation view of a layered structural member 202 that may be used in a structural component of information handling system 100, in accordance with embodiments of the present disclosure. As shown in FIG. 3, layered structural member 202 may comprise at least one outer layer 302, one core layer 304, and at least one transducer 124 (e.g., transducer 124a, transducer 124b). In some embodiments, layered structural member 202 may comprise two outer layers 302, in which core layer 304 may be sandwiched between the two outer layers 302. In other embodiments, layered structural member 202 may comprise only a single outer layer 302, in which case core layer 304 may be coupled to the single outer layer 302 via an adhesive. In one or more of these embodiments, outer layers 302 may include a laminate material. Such laminate material may be an aesthetically-pleasing structural material (e.g., plastic, aluminum, carbon fiber set in plastic polymer, a polymer fiber, aramid fiber, etc.).

Core layer 304 may comprise a layer of predominantly post-consumable material. As used herein, the term post-consumable material is intended to broadly include a waste type produced by the end consumer of a material (e.g., chassis components of an obsolete information handling system) as well as scrap material leftover from producing a particular component of an information handling system (e.g., leftover portions of sheets of chassis material of improper dimension of character to be used in a chassis). As described below, core layer 304 may be formed through processing post-consumable material to make such post-consumable material suitable for use in layered structural member 202.

As shown in FIG. 3, one or more transducers 124 may be placed or formed in voids of core layer 304, such that such one or more transducers 124 are integral to layered structural member 202. Although not depicted in FIG. 3, such one or more transducers 124 may be electrically coupled to other components of information handling system 100 (e.g., processor 103) such that each of one or more transducers 124 may receive a corresponding electrical audio signal, and convert such audio signal to a mechanical pressure, acceleration, strain or force, thus causing one or more of outer layers 302 to vibrate and generate sound. Thus, in addition to providing mechanical structure to information handling system 100, a layered structural member 202 may, in effect, be used as a speaker. Furthermore, because transducers 124 are formed within layered structural member 202 in areas which would otherwise comprise core layer 304 material, sound-producing capabilities may be included within information handling system 100 without requiring additional area for sound-producing components.

As shown in FIG. 3, layered structural member 202 may include more than one transducer 124. In such embodiments, each transducer 124 may be used to generate sound at different ranges of frequencies. For example, in particular embodiments, transducer 124a may be smaller in size than transducer 124b and may be used to generate sounds at lower frequencies than transducer 124b.

In these and other embodiments, the structure and/or material of one or more of outer layers 302 may be constructed so as to generate sound in a desired frequency range. For example, to generate higher-frequencies, an outer layer 302 may comprise a metal plate in order to achieve a high-frequency response. As another example, to generate mid-range frequencies, an outer layer 302 may comprise carbon fiber with resin applied. In addition, regardless of the material making up an outer layer 302, a stiffness, modulus and/or other physical property of the outer layer 302 may be selected as to generate sound in a desired frequency range. Furthermore, a stiffness, modulus, and/or other physical property of the outer layer 302 may be selected as to provide a desired dampening of the outer layer 302. For example, carbon fiber may have various amounts of stiffness or modulus based on it its density and arrangement (e.g., cross-weave carbon fiber may be stiffer than unidirectional carbon fiber), and the qualities of carbon fiber used may be selected based on desired levels of mechanical dampening and/or a desired frequency range of sound output from a layered structural member 202. As another example, a desired stiffness or modulus of an outer layer 302 may be obtained by employing nanoparticle loading or other mechanical loading of the outer layer 302 in order to achieve desired levels of mechanical dampening and/or a desired frequency range of sound output from a layered structural member 202.

Figure 4:
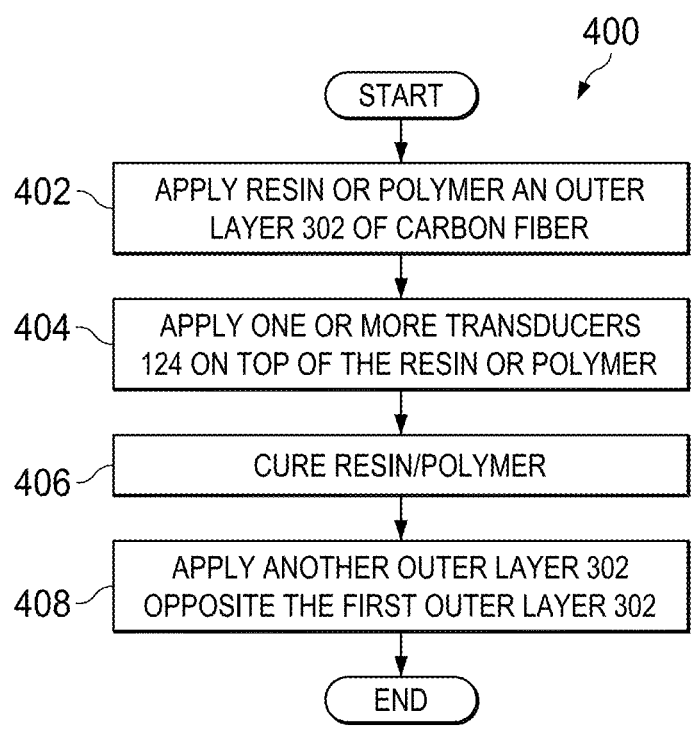
FIG. 4 illustrates a flow chart of an example method for constructing a layered structural member comprising outer layers of carbon fiber, in accordance with embodiments of the present disclosure.

FIG. 4 illustrates a flow chart of an example method for constructing a layered structural member 202 comprising outer layers 302 of carbon fiber, in accordance with embodiments of the present disclosure. According to some embodiments, method 400 may begin at step 402. However, the preferred initialization point for method 400 and the order of the steps comprising method 400 may depend on a chosen implementation.

At step 402, a resin or polymer (e.g., a ultraviolet-curable polymer) may be applied to an outer layer 302 of carbon fiber. At step 404, one or more transducers 124 may be applied on top of the resin or polymer (e.g., pressed into the resin of polymer). At step 406, the resin or polymer may be cured. At step 408, another outer layer 302 may be applied opposite the first outer layer 302, thus forming layered structural member 202 with one or more transducers integral thereto.

Although FIG. 4 discloses a particular number of steps to be taken with respect to method 400, method 400 may be executed with greater or fewer steps than those depicted in FIG. 4. In addition, although FIG. 4 discloses a certain order of steps to be taken with respect to method 400, the steps comprising method 400 may be completed in any suitable order.

Figure 5:
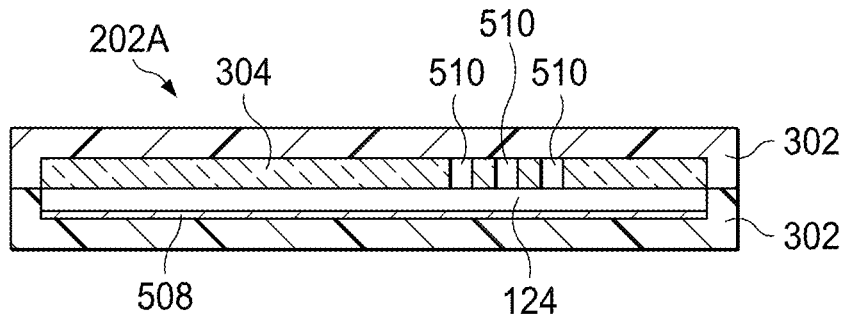
FIG. 5 illustrates a side elevation view of another layered structural member used in a structural component of the information handling system of FIG. 2, in accordance with embodiments of the present disclosure.

FIG. 5 illustrates a side elevation view of another layered structural member 202A that may be used in a structural component of the information handling system of FIG. 2, in accordance with embodiments of the present disclosure. Similar to the embodiments represented by FIG. 3, layered structural member 202A may comprise at least one outer layer 302 and one core layer 304. In the embodiments represented by FIG. 5, core layer 304 may comprise a foam material, with one or more punched-out areas 510 in which material is removed from core layer 304 that would otherwise be present in a sheet of core layer 304. Punched-out areas 304 may be cylindrical in nature. In some embodiments, punched-out areas 304 create channels between an outer layer 302 and transducer 124.

In addition, in layered structural member 202A, transducer 124 may comprise a layer of piezoelectric material formed adjacent to core layer 304 (e.g., via sputtering, deposition, or other suitable technique for forming layer of transducer 124). To provide electrical energy to transducer 124, a conductive layer 508 of conductive material may be formed adjacent to the layer of transducer 124, and may be used to electrically couple transducer 124 to an audio signal source. An outer layer 302 may be formed over conductive layer 508, thus enclosing core layer 304, transducer 124, and conductive layer 508 within layered structural member 302A.

Figure 6:
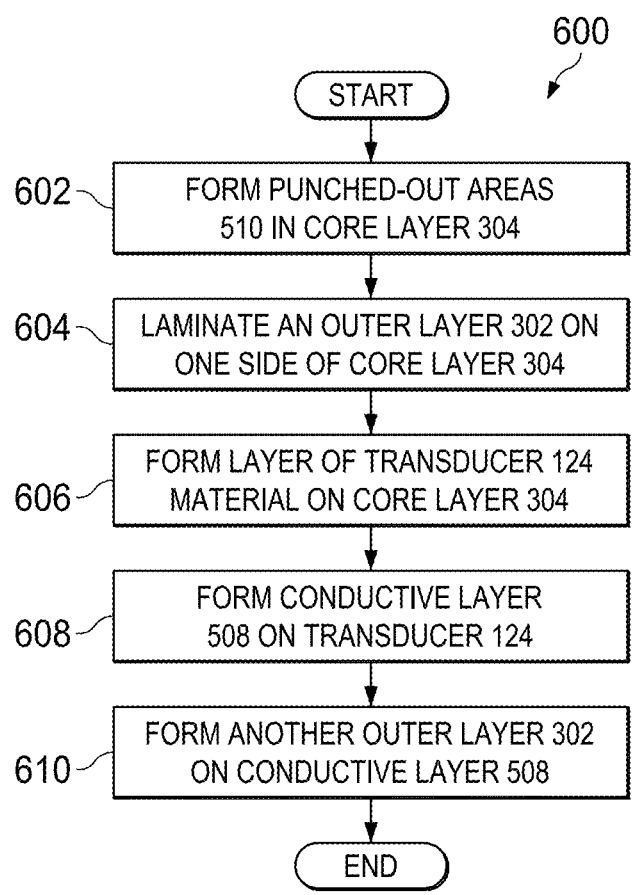
FIG. 6 illustrates a flow chart of an example method for constructing a layered structural member shown in FIG. 5, in accordance with embodiments of the present disclosure.

FIG. 6 illustrates a flow chart of an example method 600 for constructing a layered structural member shown in FIG. 5, in accordance with embodiments of the present disclosure. According to some embodiments, method 600 may begin at step 602. However, the preferred initialization point for method 600 and the order of the steps comprising method 600 may depend on a chosen implementation.

At step 602, punched-out areas 510 may be formed by removing foam material from core layer 304 in any suitable manner. At step 604, an outer layer 302 (e.g., of carbon fiber material) may be laminated on one side of core layer 304. At step 606, a layer of transducer 124 material may be deposited, bonded, or otherwise formed on core layer 304 on a side opposite of that in which outer layer 302 is formed. Such transducer material may comprise a ceramic piezoelectric material (e.g., boron titanium oxide, BTiO$_3$). At step 608, conductive layer 508 may be deposited, laminated, or otherwise formed on transducer 124. At step 610, another outer layer 302 (e.g., of carbon fiber material) may be laminated or otherwise formed on conductive layer 508, thus enclosing core layer 304, transducer 124, and conductive layer 508 within layered structural member 302A.

Although FIG. 6 discloses a particular number of steps to be taken with respect to method 600, method 600 may be executed with greater or fewer steps than those depicted in FIG. 6. In addition, although FIG. 6 discloses a certain order of steps to be taken with respect to method 600, the steps comprising method 600 may be completed in any suitable order.

Although the present disclosure has been described in detail, it should be understood that various changes, substitutions, and alterations can be made hereto without departing from the spirit and the scope of the disclosure as defined by the appended claims.

What is claimed is:

1. An information handling system fabrication method, comprising:
   forming a first chassis panel including a layered structural member, said forming of the first chassis panel comprising:
      providing a first outer layer
      coupling a layer of core material to the first outer layer;
      removing one or more portions of the layer of core material;
      forming a piezoelectric transducer by forming a layer of piezoelectric material on the layer of core material, wherein the one or more portions removed from the layer of core material define one or more channels between the first outer layer and the layer of piezoelectric material;
      forming a layer of conductive material on the layer of piezoelectric material; and
      forming a second outer layer over the layer of conductive material, wherein the piezoelectric transducer is configured to receive an audio signal and to convert the audio signal from an electrical signal into at least one of: mechanical pressure, acceleration, strain, and force, causing at least one outer layer, selected from the first outer layer and the second outer layer, to vibrate to generate sound;
   affixing the first chassis panel to a second chassis panel; and
   enclosing information handling resources, including a processor and a memory, within a chassis comprising the layered structural member.

2. The method of claim 1, further comprising:
   applying a curable substance, selected from at least one of a curable resin and a curable polymer, to the first outer layer;
   applying the piezoelectric transducer to the curable substance; and
   curing the curable substance.

3. The method of claim 1, wherein said removing of one or more portions of the layer of core material precedes said coupling of the layer of core material to the first outer layer.

4. The method of claim 3, wherein forming the layer of piezoelectric material on the layer of core material comprises one of depositing and bonding the layer of piezoelectric material to the layer of core material.

5. The method of claim 4, wherein forming the layer of conductive material on the layer of piezoelectric material comprises depositing the layer of conductive material to the layer of piezoelectric material.

6. The method of claim 3, wherein the layer of piezoelectric material comprises a ceramic material.

7. The method of claim 1, wherein forming the piezoelectric transducer comprises forming a first piezoelectric transducer and a second piezoelectric transducer, wherein the second piezoelectric transducer is larger than the first piezoelectric transducer and wherein the second piezoelectric transducer generates sound at a lower frequency than the first piezoelectric transducer.

8. The method of claim 7, wherein the layer of core material comprises foam material.

9. The method of claim 1, wherein at least one of the first outer layer, the second outer layer, and the layer of core material are adapted for generating sound within a desired frequency range.

10. The method of claim 1, wherein at least one of the first outer layer, the second outer layer, and the layer of core material comprise a plurality of different portions, wherein each of the plurality of different portions is adapted for generating sound within a respective frequency range.

11. The method of claim 1, where the layer of core material comprises predominantly post-consumable material.

12. The method of claim 1, wherein a gap is defined between the first outer layer and the second outer layer and wherein the layer of core material entirely fills the gap.

13. The method of claim 1, wherein the first outer layer comprises a laminate material.

14. The method of claim 13, wherein the laminate material includes a polymer fiber.

15. The method of claim 13, wherein the laminate material includes aramid fiber material.

16. The method of claim 13, wherein the laminate material includes carbon fiber set in plastic polymer.

17. The method of claim 1, wherein providing the first outer layer comprises providing a first outer layer having a particular physical property selected in accordance with a desired frequency range of the sound.

18. The method of claim 17, wherein the particular physical property is a stiffness of the first outer layer.

19. The method of claim 17, wherein the particular physical property is a modulus of the first outer layer.

20. An information handling system fabrication method, comprising:
  forming a first chassis panel including a layered structural member, said forming of the first chassis panel comprising:
    providing a first outer layer of material and a second outer layer of material;
    placing between the first outer layer and the second outer layer, a layer of core material;
    placing between the first outer layer and the second outer layer, a first piezoelectric transducer, the first piezoelectric transducer configured to convert an electrical signal, representative of a sound, received by the first piezoelectric transducer into at least one of: mechanical pressure, acceleration, strain, and force, causing at least one of the first and second outer layers to vibrate to generate the sound; and
    placing, between the first outer layer and the second outer layer, a second piezoelectric transducer, the second piezoelectric transducer configured to convert an audio signal received by the second piezoelectric transducer into at least one of: mechanical pressure, acceleration, strain and force, causing the layered structural member to generate sound, wherein the second piezoelectric transducer is adapted for generating sound at a different range of frequencies than the first piezoelectric transducer;
  affixing the first chassis panel to a second chassis panel; and
  enclosing information handling resources, including a processor and a memory, within a chassis comprising the layered structural member.

* * * * *